(12) United States Patent
Lee et al.

(10) Patent No.: US 12,197,112 B2
(45) Date of Patent: Jan. 14, 2025

(54) CAMERA MODULE WITH SHIELD CAN

(71) Applicant: LG INNOTEK CO., LTD., Seoul (KR)

(72) Inventors: Sang Ah Lee, Seoul (KR); Joo Young Lee, Seoul (KR); Yong Seok Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 90 days.

(21) Appl. No.: 18/010,860

(22) PCT Filed: Jun. 24, 2021

(86) PCT No.: PCT/KR2021/007980
§ 371 (c)(1),
(2) Date: Dec. 16, 2022

(87) PCT Pub. No.: WO2022/005110
PCT Pub. Date: Jun. 1, 2022

(65) Prior Publication Data
US 2023/0236478 A1 Jul. 27, 2023

(30) Foreign Application Priority Data

Jun. 30, 2020 (KR) .................. 10-2020-0080522

(51) Int. Cl.
*G03B 17/55* (2021.01)
*G03B 30/00* (2021.01)
(Continued)

(52) U.S. Cl.
CPC ............ *G03B 17/55* (2013.01); *G03B 30/00* (2021.01); *H04N 5/222* (2013.01); *H04N 23/51* (2023.01)

(58) Field of Classification Search
CPC ........ G03B 17/55; G03B 30/00; G03B 17/12; G03B 17/02; H04N 5/222; H04N 23/51;
(Continued)

(56) References Cited

U.S. PATENT DOCUMENTS

2016/0178923 A1 6/2016 Hayashi
2018/0227466 A1* 8/2018 Park .................. H04N 7/18
(Continued)

FOREIGN PATENT DOCUMENTS

JP 2015-34912 A 2/2015
KR 10-2011-0101671 A 9/2011
(Continued)

OTHER PUBLICATIONS

Extended European Search Report for European Application No. 21834088.3, dated Jun. 12, 2024.

*Primary Examiner* — Padma Haliyur
(74) *Attorney, Agent, or Firm* — Birch, Stewart, Kolasch & Birch, LLP

(57) ABSTRACT

A camera module comprises: a first housing; a lens module disposed in the first housing; a second housing coupled to the first housing; a first printed circuit board disposed in the inner space of the first housing and the second housing; an image sensor disposed on the first printed circuit board; and a shield can disposed under the first printed circuit board in the second housing, wherein the shield can comprises a rib which comes into contact with the lower surface of the first printed circuit board.

13 Claims, 7 Drawing Sheets

(51) Int. Cl.
*H04N 5/222* (2006.01)
*H04N 23/51* (2023.01)

(58) Field of Classification Search
CPC ........ H04N 23/52; H04N 23/54; H04N 23/57; H04N 23/55; H05K 9/0024
See application file for complete search history.

(56) References Cited

U.S. PATENT DOCUMENTS

| | | | |
|---|---|---|---|
| 2019/0028620 A1* | 1/2019 | Park | H05K 9/0024 |
| 2020/0053258 A1* | 2/2020 | Park | H04N 23/52 |
| 2020/0110243 A1* | 4/2020 | Lee | G03B 13/36 |
| 2020/0177775 A1* | 6/2020 | Park | H04N 23/51 |

FOREIGN PATENT DOCUMENTS

| | | | |
|---|---|---|---|
| KR | 10-2012-0005705 A | 1/2012 | |
| KR | 10-2017-0108668 A | 9/2017 | |
| KR | 10-2018-0049491 A | 5/2018 | |
| WO | WO-2018066911 A1 * | 4/2018 | ............. G03B 17/02 |

* cited by examiner

CAMERA MODULE WITH SHIELD CAN

CROSS REFERENCE TO RELATED APPLICATIONS

This application is the National Phase of PCT/KR2021/007980 filed on Jun. 24, 2021, which claims priority under 35 U.S.C. § 119 (a) to Patent Application No. 10-2020-0080522 filed in the Republic of Korea on Jun. 30, 2020, all of which are hereby expressly incorporated by reference into the present application.

TECHNICAL FIELD

The present embodiment relates to a camera module.

BACKGROUND ART

Recently, ultra-small camera modules are being developed, and ultra-small camera modules are widely used in small electronic products such as smartphones, laptops, and game consoles.

As the spread of automobiles becomes more popular, ultra-small cameras are widely used not only in small electronic products but also in vehicles. For example, black box cameras for vehicle protection or objective data of traffic accidents, rear surveillance cameras that allow drivers to monitor blind spots at the rear of the vehicle through screens to ensure safety when reversing the vehicle, and peripheral detection cameras capable of monitoring the surroundings of the vehicle, and the like are provided.

The camera may include a lens, a lens holder accommodating the lens, an image sensor that converts an image of a subject gathered in the lens into an electrical signal, and a printed circuit board on which the image sensor is mounted. The housing forming an outer shape of the camera has a structure in which the entire region is sealed to prevent contamination of internal components from foreign substances including moisture.

DETAILED DESCRIPTION OF THE INVENTION

Technical Subject

The present embodiment is to provide a camera module that can enhance heat dissipation efficiency by improving the structure.

Technical Solution

A camera module according to the present embodiment comprises: a first housing;
a lens module being disposed in the first housing; a second housing being coupled to the first housing; a first printed circuit board being disposed in an inner space of the first housing and the second housing; an image sensor being disposed on the first printed circuit board; and a shield can being disposed at a lower portion of the first printed circuit board in the second housing, wherein the shield can includes a rib being in contact with a lower surface of the first printed circuit board.

The shield can includes a side plate, and at least a portion of the rib is bent inward from an upper end of the side plate such that an upper surface thereof may be in contact with a lower surface of the first printed circuit board.

A lower surface of the first printed circuit board may be soldered to an upper surface of the rib.

An exposed portion in which electrodes inside the first printed circuit board are exposed may be disposed in a lower surface of the first printed circuit board facing the rib.

The rib is provided in pluralities and may be disposed to be spaced apart from one another.

The material of the first housing is resin or plastic, and the material of the shield can may be a metal.

It includes a second printed circuit board being disposed at a lower portion of the first printed circuit board and being spaced apart from the shield can, wherein the second printed circuit board may be disposed at a lower portion of the rib.

The cross-sectional area of the second printed circuit board may be smaller than the cross-sectional area of the first printed circuit board.

It may include a cable being electrically connected to a lower surface of the second printed circuit board, and a flexible circuit board electrically connecting the first printed circuit board and the second printed circuit board.

A camera module according to another embodiment comprises: a first housing; a lens module being disposed in the first housing; a second housing being coupled to the first housing; a first printed circuit board being disposed in an inner space of the first housing and the second housing; an image sensor being disposed on the first printed circuit board; and a shield can being disposed below the first printed circuit board in the second housing, wherein a lower surface of the first printed circuit board may be soldered to an upper surface of the shield can.

Advantageous Effects

According to the present invention, it is possible to provide a camera module capable of enhancing heat dissipation efficiency by transferring heat generated in a substrate module to the outside through the shield can.

EMBODIMENT

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components.

In addition, when expressed as "on (above)" or "below (under)", the meaning of not only an upward direction but also a downward direction based on one component may be included.

The 'optical axis direction' used below is defined as the optical axis direction of the lens. Meanwhile, the 'optical axis direction' may correspond to a 'vertical direction', a 'z-axis direction', and the like.

Hereinafter, the present invention will be described in more detail with reference to the accompanying drawings.

Figure 1:
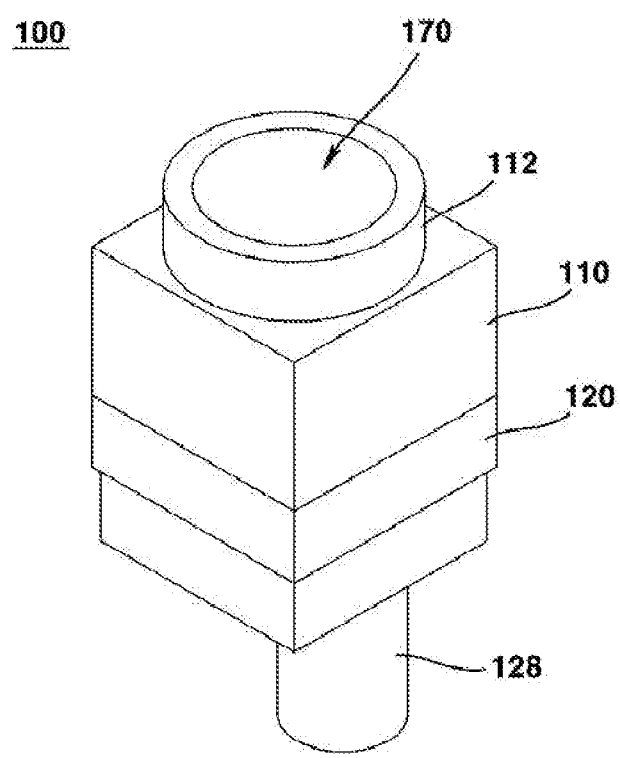
FIG. 1 is a perspective view of a camera module according to a first embodiment of the present invention.
Figure 2:
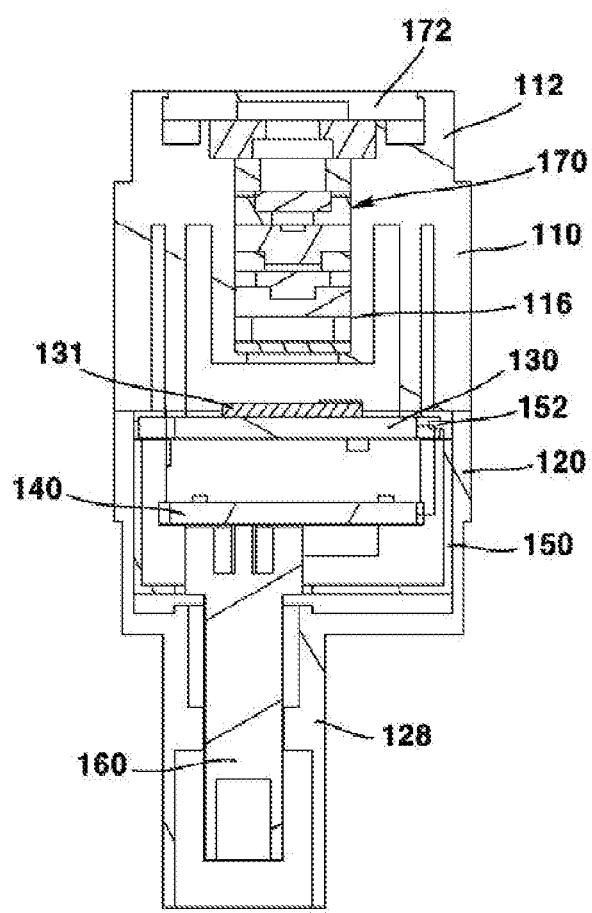
FIG. 2 is a cross-sectional view showing the internal configuration of the camera module according to a first embodiment of the present invention.
Figure 3:
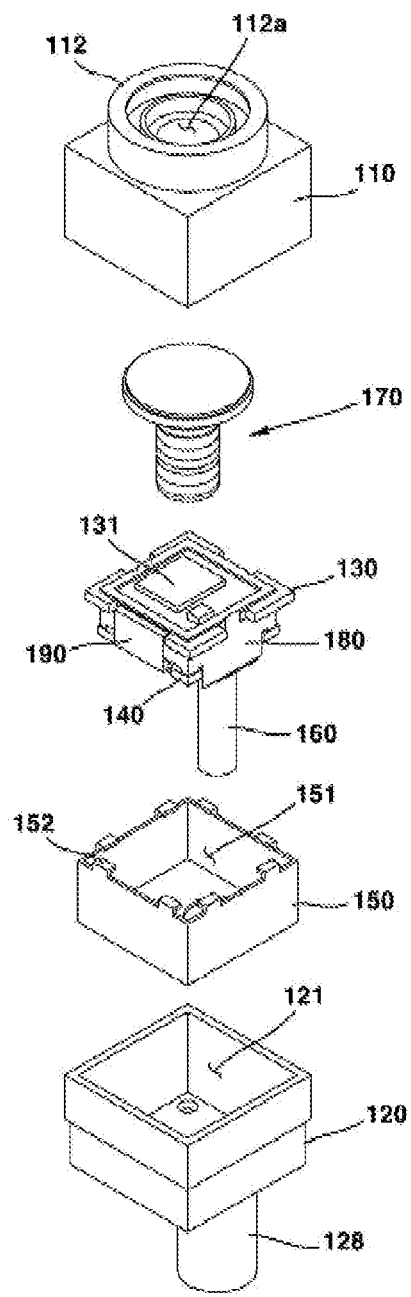
FIG. 3 is an exploded perspective view of a camera module according to a first embodiment of the present invention.
Figure 4:
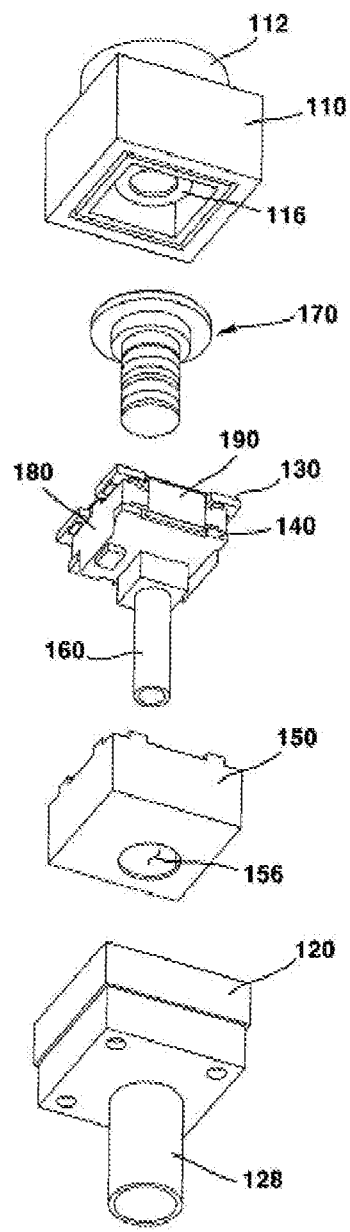
FIG. 4 is an exploded perspective view of FIG. 3 illustrated from another angle.
Figure 5:
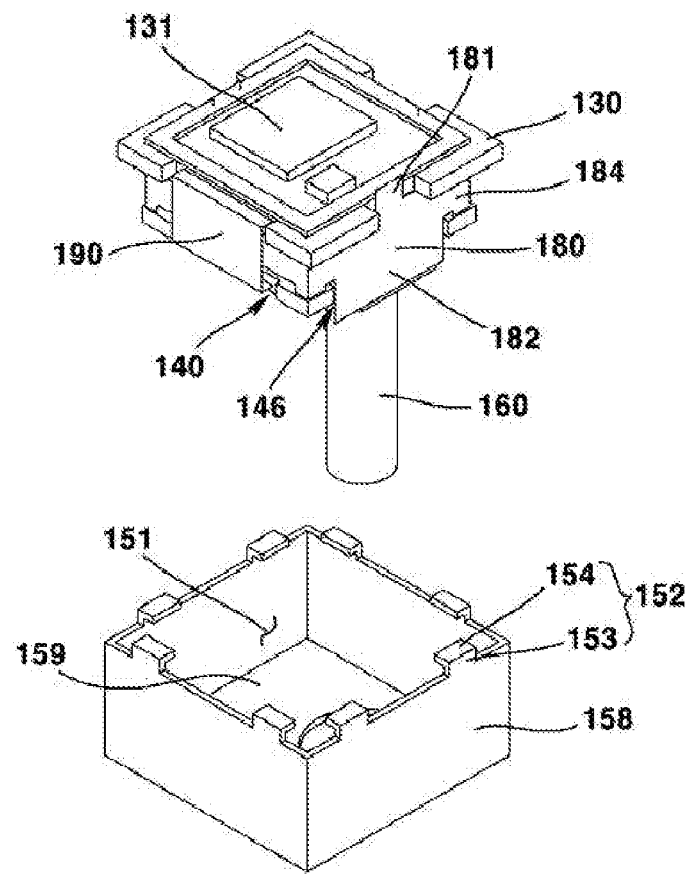
FIG. 5 is an exploded perspective view of a substrate module and a shield can according to a first embodiment of the present invention.
Figure 6:
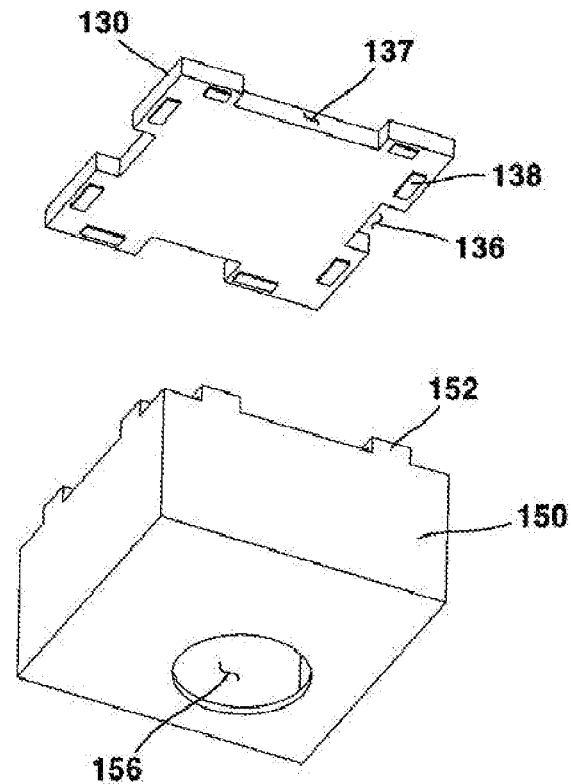
FIG. 6 is an exploded perspective view of a first printed circuit board and a shield can according to a first embodiment of the present invention.

FIG. 1 is a perspective view of a camera module according to a first embodiment of the present invention; FIG. 2 is a cross-sectional view showing the internal configuration of the camera module according to a first embodiment of the present invention; FIG. 3 is an exploded perspective view of a camera module according to a first embodiment of the present invention; FIG. 4 is an exploded perspective view of FIG. 3 illustrated from another angle; FIG. 5 is an exploded perspective view of a substrate module and a shield can according to a first embodiment of the present invention; and FIG. 6 is an exploded perspective view of a first printed circuit board and a shield can according to a first embodiment of the present invention.

Referring to FIGS. 1 to 6, a camera module 100 according to the embodiment of the present invention may comprise: a first housing 110; a second housing 120; a first printed circuit board 130; a second printed circuit board 140; a shield can 150; a cable 160; a lens module 170; a spacer member; and a flexible circuit board 190, but it may be implemented except for some of these configurations, and does not exclude additional configurations.

The camera module 100 may include a first housing 110. The first housing 110 may form an outer appearance of the camera module 100. The first housing 110 may be coupled to the second housing 120. The first housing 110 may be disposed at one side of the second housing 120. The first housing 110 may be formed in a hexahedral shape with an open lower portion. The first housing 110 may be coupled to the second housing 120 by thermal fusion. The material of the first housing 110 may include plastic or resin. The lens module 170 may be disposed in the first housing 110.

The camera module 100 may include a second housing 120. The second housing 120 may form an outer appearance of the camera module 100. The second housing 120 may be coupled to the first housing 110. The second housing 120 may be disposed at another side of the first housing 110. The second housing 120 may be formed in a hexahedral shape with an open upper portion. A first printed circuit board 130, a second printed circuit board 140, a shield can 150, a cable 160, a bracket 180, and a flexible circuit board 190 may be disposed in the second housing 120. The material of the second housing 120 may include resin or plastic. Unlike this, the second housing 120 may be formed of a metal material.

The camera module 100 may include a lens module 170. The lens module 170 may be disposed in the first housing 110. The lens module 170 may include at least one lens. The lens module 170 includes a plurality of lenses, and the plurality of lenses may be disposed along an optical axis direction. Among them, the outermost lens 172 may be exposed above the first housing 110. A lens coupling part 112 being protruded upward from an upper surface of the first housing 110 and being formed with an accommodating groove 112a so that the outermost lens 172 is disposed therein. A plurality of lenses other than the outermost lens 172 may be disposed in the opening 116 of the first housing 110. The lens module 170 may be coupled to the first housing 110. The lens module 170 may be screw-coupled to the first housing 110. The lens module 170 may be disposed to face an image sensor 131, which will be described later.

The camera module 100 may include a substrate module. The substrate module may include a first printed circuit board 130, a second printed circuit board 140, a spacer member, and a flexible circuit board 190.

The first printed circuit board 130 may be disposed in an inner space of the first housing 110 and the second housing 120. The first printed circuit board 130 may be disposed in the second housing 120. An image sensor 131 may be disposed on the first printed circuit board 130. The image sensor 131 may be disposed to face the lens module in an optical axis direction. The image sensor 131 may form an image through light passing through the lens module 170.

The first printed circuit board 130 may have a rectangular cross-sectional shape. The first printed circuit board 130 may have four sides. The first printed circuit board 130 may have four side surfaces. A first groove 136 and a second groove 137 may be disposed in a side surface of the first printed circuit board 130. Each of the first groove 136 and the second groove 137 may be formed to be more recessed inward than the other regions on the side surface of the first printed circuit board 130. The length of the first groove 136 in a direction perpendicular to the optical axis direction may be shorter than the length of the second groove 137. The first groove 136 may be respectively disposed on three side surfaces among the four side surfaces of the first printed circuit board 130. The second groove 137 may be disposed on the other side surface of the first printed circuit board 130 except for the three side surfaces among the four side surfaces.

The second printed circuit board 140 may be disposed at a lower portion of the first printed circuit board 130. The second printed circuit board 140 may be disposed to be spaced apart from the first printed circuit board 130 in an up and down direction. The cross-sectional area of the second printed circuit board 140 may be smaller than the cross-sectional area of the first printed circuit board 130. The second printed circuit board 140 may have a rectangular cross-sectional shape. A cable 160 may be coupled to a lower surface of the second printed circuit board 140. The second printed circuit board 140 may be disposed inside the shield can 150. The side surface of the second printed circuit board 140 may be spaced apart from the inner surface of the shield can 150.

A groove may also be formed in a side surface of the second printed circuit board 140. In a side surface of the second printed circuit board 140, a third groove 146 facing the first groove 136 in an up and down direction, and a fourth groove 147 facing the second groove 137 in an up and down direction may be disposed.

The first printed circuit board 130 and the second printed circuit board 140 may be coupled to each other through a spacer member. The spacer member may include a bracket 180. The bracket 180 may be formed of a metal material. The bracket 180 may be a shield can in which the first printed circuit board 130 and the second printed circuit board 140 are disposed at an inner side thereof. At this time, the first printed circuit board 130 is disposed in an upper portion; the second printed circuit board 140 is disposed at an inner side thereof; the shield can 150 being accommodated inside the second housing 120 is called a first shield can; and the bracket 180 separating the first printed circuit board 130 and the second printed circuit board 140 may be called a second shield can.

The upper end of the bracket 180 is coupled to the first printed circuit board 130 through the first groove 136 and the lower end may be coupled to the second printed circuit board 140 through the third groove 146. The first 136 and third groove 146 are provided in plurality, respectively, so that the first printed circuit board 130 and the second printed circuit board 140 may have a coupling structure in a plurality of regions through the bracket. The bracket 180 may be formed of a metal material. The bracket 180 may include a side plate 184 whose upper end supports a lower surface of the first printed circuit board 130 and a lower end thereof is supported by the upper surface of the second printed circuit board 140. By the side plate 184, the first printed circuit board 130 and the second printed circuit board 140 may be spaced apart from each other in an up and down direction. A region of the bracket 180 being coupled to the first groove 136 and the third groove 146 may have a rib shape being extended from the upper and lower ends of the side plate 184 in an up and down direction, respectively. More specifically, the bracket 180 may comprise: a side plate 184 being disposed between the first printed circuit board 130 and the second printed circuit board 140; an upper rib 181 being extended upward from an upper end of the side plate 184 and coupled to the first groove 136; and a lower rib 182 being extending downward from a lower end of the side plate and coupled to the third groove 146. The upper rib 181 and the lower rib 182 include a region bent at least once so that each region may have a region being in contact with an upper surface of the first printed circuit board 130 and a lower surface of the second printed circuit board 140. Accordingly, the first printed circuit board 130 and the second printed circuit board 140 are spaced apart in an up and down direction and may be fixed to each other.

The first printed circuit board 130 and the second printed circuit board 140 may be electrically connected to each other through a flexible printed circuit board (FPCB) 190. The flexible printed circuit board 190 may have a region bent at least once. The flexible circuit board 190 is formed of a flexible material so that an upper end thereof is electrically connected to the first printed circuit board 130, and a lower end thereof may be electrically connected to the second printed circuit board 140. At least a portion of the flexible printed circuit board 190 may be disposed in the second groove 137 and the fourth groove 147, respectively.

The cable 160 may be coupled to a lower surface of the substrate module. The cable 160 may be coupled to a lower surface of the second printed circuit board 140. The cable 160 may be electrically connected to the second printed circuit board 140. The cable 160 may supply external power to the substrate module.

The cable 160 may be disposed in the second housing 120. An external terminal coupling part 128 being extended downwardly and having a space for accommodating the cable 160 therein may be formed on a lower surface of the second housing 120. An external terminal may be coupled to the external terminal coupling part 128. The external terminal may provide power to the camera module 100 or transmit and receive signals to and from the camera module 100. The space inside the external terminal coupling part 128 may communicate with the space 121 inside the second housing 120. A lower surface of the external terminal coupling part 128 may be opened.

A shield can 150 may be disposed inside the second housing 120. The shield can 150 may be disposed in the space 121 inside the second housing 120. An outer side surface of the shield can 150 may be disposed to face an inner side surface of the second housing 120. The outer side surface of the shield can 150 may be in contact with the inner side surface of the second housing 120.

The shield can 150 may have an open upper surface. A hole 156 may be formed in a lower surface of the shield can 150 to allow the cable 160 to penetrate therethrough. A space portion 151 for accommodating the substrate module may be formed inside the shield can 150. The second printed circuit board 140 and the flexible circuit board 190 may be disposed in the space portion 151. That is, in the substrate module, the remaining configurations except for the first printed circuit board 130 are disposed in the space portion 151 inside the shield can 150, and the first printed circuit board 130 may be disposed at an upper side of the shield can 150 through a rib 152, which will be described later.

The shield can 150 may be formed of a metal material. The shield can 150 may be integrally formed with the second housing 120 by insert injection.

The shield can 150 may support a lower surface of the first printed circuit board 130. The upper end of the shield can 150 may be in contact with a lower surface of the first printed circuit board 130. The first printed circuit board 130 may be soldered on the shield can 150. The shield can 150 may be used for electrical conduction or grounding of a substrate module including the first printed circuit board 130.

The shield can 150 may include a side plate 158 forming a side surface and a lower surface plate 159 forming a lower surface. The above-described hole 156 may be formed in the lower plate 159. The space portion 151 may be formed at an inner side of the side plate 158.

The shield can 150 may include a rib 152 supporting the first printed circuit board 130. The rib 152 may support a lower surface of the first printed circuit board 130. A lower surface of the first printed circuit board 130 and an upper surface of the rib 152 may be soldered. A lower surface of the first printed circuit board 130 may be in contact with the rib 152.

At least a portion of the rib 152 may have a region parallel to the first printed circuit board 130. The rib 152 may include a vertical portion 153 being extended upwardly from an upper end of the side plate 158 and a horizontal portion 154 being bent inward from an end portion of the vertical portion 153. The horizontal portion 154 may be disposed to cover at least a portion of the space portion 151. The horizontal portion 154 may be disposed parallel to the first printed circuit board 130. An upper surface of the horizontal portion 154 may be in contact with a lower surface of the first printed circuit board 130. A lower surface of the first printed circuit board 130 may be soldered to an upper surface of the horizontal portion 154. An upper surface of the horizontal portion 154 may be in surface contact with a lower surface of the first printed circuit board 130.

The ribs 152 may be provided in plurality and disposed to be spaced apart from each other. Assuming that the shield can 150 is formed to have a rectangular cross-section having four sides, the ribs 152 may be disposed two per side. At this time, the plurality of ribs 152 being provided with a single side may be disposed to be spaced apart from one another.

Meanwhile, the cross-sectional area of the virtual region connecting the inner end portions of the plurality of horizontal portions 154 may be smaller than the cross-sectional area of the second printed circuit board 140. Accordingly, it is possible to prevent the second printed circuit board 140 from being arbitrarily separated from the space portion 151. The cross-sectional area of the second printed circuit board 140 may correspond to the cross-sectional area of the space portion 151 or may be formed smaller.

In a region facing the rib 152 among a lower surface of the first printed circuit board 130, an exposed portion 138 in which electrodes are exposed inside the first printed circuit board 130 may be disposed. The electrode may be a ground electrode.

The exposed portion 138 may be provided in plurality. The plurality of exposed portions 138 may be disposed to be spaced apart from one another along the lower edge of the lower surface of the first printed circuit board 130 to form a pattern. The exposed portion 138 may be provided to correspond to the position and number of the ribs 152 on a lower surface of the first printed circuit board 130. The plurality of exposed portions 138 may be disposed to be spaced apart from one another along the edge of the first printed circuit board 130. Accordingly, the first printed circuit board 130 may form a contact structure with the shield can 150 in different regions, thereby improving heat dissipation efficiency.

Assuming that the cross-section of the first printed circuit board 130 is rectangular, the plurality of exposed portions 138 being disposed on one side may be disposed symmetrically to one another about the first groove 136 or the second groove 137.

Accordingly, the exposed portion 138 is soldered to the rib 152 so that the substrate module can be grounded.

According to the above structure, there is an advantage in that heat generated in the substrate module can be transferred to the outside through the shield can, thereby enhancing heat dissipation efficiency. In particular, even when the material of the first housing is made of plastic, heat generated in the module can be transferred in the direction of the second housing through the shield can made of metal, so that there is an advantage in that an efficient heat dissipation path can be formed.

In addition, by firmly fixing the first printed circuit board on which the image sensor is disposed on the shield can, there is an advantage that focusing with the lens module can be performed more easily.

Figure 7:
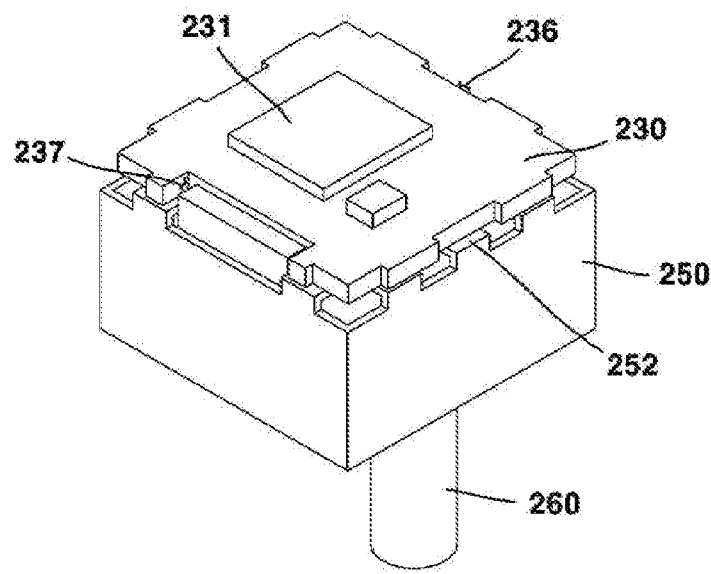
FIG. 7 is a perspective view illustrating the coupling of a substrate module and a shield can according to a second embodiment of the present invention.
Figure 8:
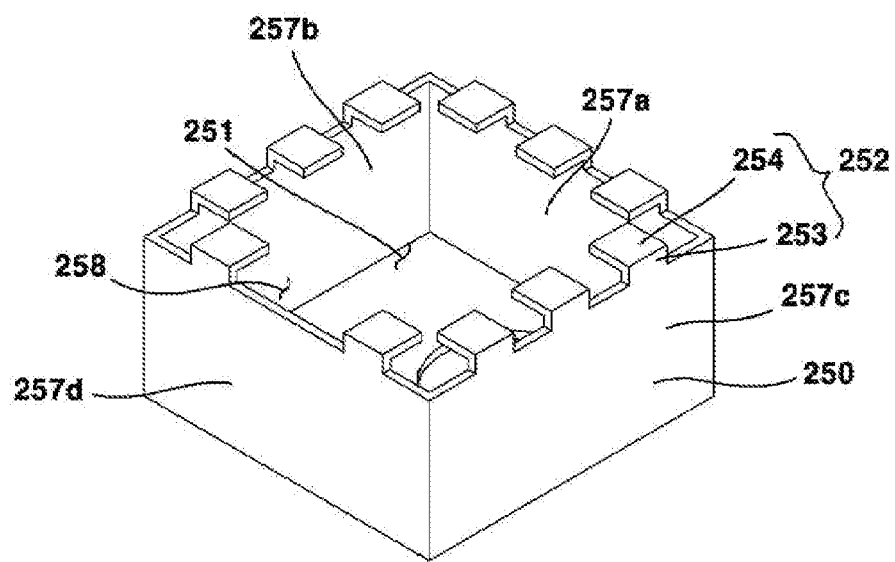
FIG. 8 is a perspective view of a shield can according to a second embodiment of the present invention.

FIG. 7 is a perspective view illustrating the coupling of a substrate module and a shield can according to a second embodiment of the present invention; FIG. 8 is a perspective view of a shield can according to a second embodiment of the present invention; and FIG. 9 is a perspective view of a first printed circuit board according to a second embodiment of the present invention.

In the present embodiment, other parts are the same as in the first embodiment, but there is a difference in the arrangement structure of the rib and the exposed portion. Hereinafter, only the characteristic parts of the present embodiment will be described, and the first embodiment will be used for the remaining parts.

Figure 9:
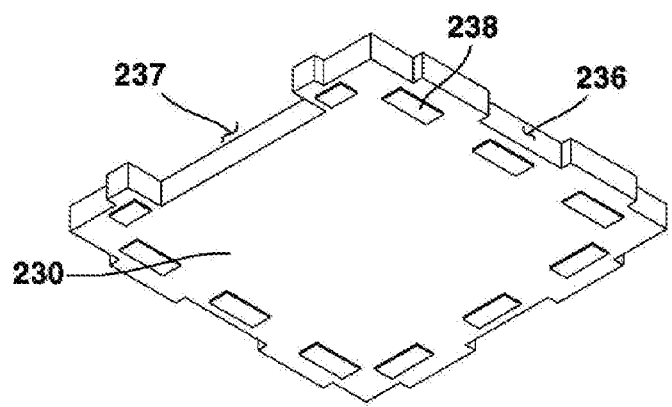
FIG. 9 is a perspective view of a first printed circuit board according to a second embodiment of the present invention.

Referring to FIGS. 7 to 9, the shield can 250 according to the present embodiment may include a plurality of ribs 252. The plurality of ribs 252 may be disposed at an upper portion of the shield can 250. Each of the plurality of ribs 252 may include a vertical portion 253 being extended upward from a side plate of the shield can 250 and a horizontal portion 254 being bent inward from an upper end of the vertical portion 253. An upper surface of the horizontal portion 254 may support a lower surface of the first printed circuit board 230.

The shield can 250 may comprise: a first side plate 257*a*; a second side plate 257*b* adjacent to the first side plate 257*a*; a third side plate 257*c*; and a fourth side plate 257*d* being disposed to face the first side plate 257*a*. Three ribs 252 may be disposed at an upper portion of the first to third side plates 257*a*, 257*b*, and 257*c*, respectively.

A smaller number of ribs 252 than other side plates may be disposed in the fourth side plate 257*d* being disposed to face the first side plate 257*a*. For an example, two ribs 252 may be disposed at an upper portion of the fourth side plate 257*d*. A separation space 258 may be formed between the two ribs 252.

The first printed circuit board 230 may be disposed at an upper portion of the shield can 250. A lower surface of the first printed circuit board 230 may be in contact with the rib 252. An exposed portion 238 in which a copper foil is exposed may be formed at a lower surface of the first printed circuit board 230. The exposed portion 238 may be disposed to correspond to the number and position of the ribs 252.

A first groove 236 and a second groove 237 may be disposed at a side surface of the first printed circuit board 230. Each of the first groove 236 and the second groove 237 may be formed to be recessed more inward than the other regions of the side surface of the first printed circuit board 230. The length of the first groove 236 may be formed to be shorter than the length of the second groove 237.

In the first printed circuit board 230 having a rectangular cross section, the side surfaces of the first printed circuit board 230 in which the first groove 236 is formed may be disposed to face the first to third side plates 257*a*, 257*b*, and 257*c* in an up and down direction. In addition, a side surface of the first printed circuit board 230 in which the second groove 237 is disposed may be disposed to face the fourth side plate 257*d* in in an up and down direction.

Accordingly, when the first printed circuit board 230 is coupled to an upper surface of the shield can 250, a space in which the flexible circuit board 190 (refer to FIGS. 1 to 6) is disposed through the second groove 237 and the separation space 258 may be formed.

According to the structure as described above, the first printed circuit board 230 is firmly fixed inside the camera module by the rib 252 and, at the same time, there is an advantage in that the arrangement space of the flexible circuit board can be secured more widely for electrical connection with the second printed circuit board.

Although the embodiment of the present invention has been described above with reference to the accompanying drawings, those of ordinary skill in the art to which the present invention belongs will understand that the present invention may be embodied in other specific forms without changing the technical spirit or essential features thereof.

Therefore, it should be understood that the embodiments described above are illustrative in all respects and not restrictive.

The invention claimed is:

1. A camera module comprising:
a first housing;
a lens module being disposed in the first housing;
a second housing being coupled to the first housing;
a first printed circuit board being disposed in an inner space of the first housing and the second housing;
a second printed circuit board being disposed at a lower portion than the first printed circuit board;
an image sensor being disposed on the first printed circuit board; and
a shield can being disposed at a lower portion than the first printed circuit board in the second housing,
wherein the second printed circuit board is disposed within the shield can,
wherein the shield can includes a side plate and a rib being in contact with a lower surface of the first printed circuit board,
wherein the rib includes a vertical portion extending upward from an upper end of the side plate and a horizontal portion bent inward from a top of the vertical portion,
wherein an exposed portion in which electrodes inside the first printed circuit board are exposed is disposed in a lower surface of the first printed circuit board facing the rib, and
wherein the exposed portion is soldered to an upper surface of the horizontal portion.

2. The camera module according to claim 1, wherein the rib is provided in pluralities and disposed to be spaced apart from one another.

3. The camera module according to claim 1, wherein the material of the first housing is resin or plastic, and
wherein the material of the shield can is a metal.

4. The camera module according to claim 1, wherein a bracket is disposed between the first printed circuit board and the second printed circuit board.

5. The camera module according to claim 1, wherein the cross-sectional area of the second printed circuit board is smaller than the cross-sectional area of the first printed circuit board.

6. The camera module according to claim 1, including:
a cable being electrically connected to a lower surface of the second printed circuit board; and
a flexible circuit board electrically connecting the first printed circuit board and the second printed circuit board.

7. The camera module according to claim 1, wherein the shield can is integrally formed with the second housing by insert molding.

8. The camera module according to claim 4, wherein a first groove coupled to the bracket is disposed on a side surface of the first printed circuit board, and
wherein a third groove coupled to the bracket is disposed on a side surface of the second printed circuit board facing the first groove.

9. The camera module according to claim 6, wherein a second groove in which the flexible circuit board is disposed on a side surface of the first printed circuit board, and
wherein a fourth groove in which the flexible printed circuit board is disposed is disposed in a region facing the second groove among side surfaces of the second printed circuit board.

10. The camera module according to claim 2, wherein a cross-sectional area of an area connecting inner ends of the plurality of ribs is smaller than a cross-sectional area of the second printed circuit board.

11. The camera module according to claim 1, wherein the shield can has four sides, and
wherein the ribs are provided in plurality on each of the four sides.

12. A camera module comprising:
a first housing;
a lens module being disposed in the first housing;
a second housing being coupled to the first housing;
a first printed circuit board being disposed in an inner space of the first housing and the second housing;
a second printed circuit board being disposed at a lower portion than the first printed circuit board;
an image sensor being disposed on the first printed circuit board; and
a shield can being disposed below the first printed circuit board in the second housing,
wherein the second printed circuit board is disposed within the shield can,
wherein a lower surface of the first printed circuit board is soldered to an upper surface of the shield can,
wherein the shield can includes a side plate and a rib being in contact with a lower surface of the first printed circuit board,
wherein the rib includes a vertical portion extending upward from an upper end of the side plate and a horizontal portion bent inward from a top of the vertical portion,
wherein an exposed portion in which electrodes inside the first printed circuit board are exposed is disposed in a lower surface of the first printed circuit board facing the rib, and
wherein the exposed portion is soldered to an upper surface of the horizontal portion.

13. The camera module according to claim 12, wherein the rib is provided in pluralities and disposed to be spaced apart from one another, and
wherein a cross-sectional area of an area connecting inner ends of the plurality of ribs is smaller than a cross-sectional area of the second printed circuit board.

* * * * *